(12) United States Patent
Levi et al.

(10) Patent No.: US 7,482,836 B2
(45) Date of Patent: Jan. 27, 2009

(54) HIGH BANDWIDTH RECONFIGURABLE ON-CHIP NETWORK FOR RECONFIGURABLE SYSTEMS

(75) Inventors: Delon Levi, Santa Clara, CA (US); Tobias J. Becker, Bergisch Gladbach (DE)

(73) Assignee: Xilinx, Inc., San Jose, CA (US)

( * ) Notice: Subject to any disclaimer, the term of this patent is extended or adjusted under 35 U.S.C. 154(b) by 184 days.

(21) Appl. No.: 11/789,958

(22) Filed: Apr. 25, 2007

(65) Prior Publication Data

US 2007/0200594 A1    Aug. 30, 2007

Related U.S. Application Data

(62) Division of application No. 10/981,932, filed on Nov. 5, 2004, now Pat. No. 7,224,184.

(51) Int. Cl.
*H01L 25/00* (2006.01)
*H03K 19/177* (2006.01)

(52) U.S. Cl. .................. 326/41; 326/38; 326/47

(58) Field of Classification Search ............. 326/38–41, 326/47
See application file for complete search history.

(56) References Cited

U.S. PATENT DOCUMENTS

| | | | |
|---|---|---|---|
| 6,492,834 B1 | 12/2002 | Lytle et al. | |
| 6,594,810 B1 * | 7/2003 | Reblewski et al. | ............ 716/12 |
| 6,625,793 B2 | 9/2003 | Sample et al. | |
| 6,759,869 B1 | 7/2004 | Young et al. | |
| 6,810,514 B1 | 10/2004 | Alfke et al. | |
| 6,920,627 B2 | 7/2005 | Blodget et al. | |
| 6,947,882 B1 | 9/2005 | Reblewski et al. | |
| 7,149,996 B1 | 12/2006 | Lysaght et al. | |
| 2004/0027155 A1 * | 2/2004 | Schlansker et al. | ............ 326/38 |
| 2006/0015674 A1 * | 1/2006 | Murotake | ................... 711/101 |

* cited by examiner

*Primary Examiner*—Anh Q Tran
(74) *Attorney, Agent, or Firm*—Thomas A. Ward

(57) ABSTRACT

A crossbar switch is implemented in a reconfigurable circuit, such as a FPGA, instantiated with a number of modules, the crossbar switch providing communication links between the modules. The modules and crossbar switch can be easily updated in a partial reconfiguration process changing only portions of modules and the crossbar switch while other portions remain active. The crossbar switch uses individual wiring to independently connect module outputs and inputs so that asynchronous communications can be used. The crossbar switch can be implemented in different embodiments including a Clos crossbar switch, and a crossbar switch connecting each module output only to a corresponding module input, allowing for a reduction in the amount of FPGA resources required to create the crossbar switches.

7 Claims, 9 Drawing Sheets

HIGH BANDWIDTH RECONFIGURABLE ON-CHIP NETWORK FOR RECONFIGURABLE SYSTEMS

BACKGROUND

1. Technical Field

The present invention relates to a reconfigurable system, such as a programmable logic device, configured to provide communication between different modules.

2. Related Art

Reconfigurable systems, such as FPGAs, have traditionally been used as off-the-shelf replacements for Application Specific Integrated Circuits (ASICs), or as customizable versions of Application Specific Standard Products (ASSPs). As opposed to ASICs or ASSPs, programmability enables FPGAs to be purchased by customers and configured to provide a desired circuit. The FPGAs are further reconfigurable allowing reprogramming after startup. Reconfigurability allows FPGAs, for example, to be used for software-defined radios that have circuitry controlling their frequencies updated as the radio location changes. As another example, decryption algorithms have their keys and decoding circuits updated over time.

A block diagram of components of a conventional FPGA is shown in FIG. 1. The FPGA includes input/output (I/O) blocks 2 (each labeled 10) located around the perimeter of the FPGA, multi-gigabit transceivers (MGT) 4 interspersed with the I/O blocks 2, configurable logic blocks 6 (each labeled CLB) arranged in an array, block random access memory 8 (each labeled BRAM) interspersed with the CLBs, configuration logic 12, configuration interface 14, on-chip processor 16 and an internal configuration access port (ICAP) 20. The FPGA also includes other elements, such as a programmable interconnect structure and a configuration memory array, which are not illustrated in FIG. 1. Although FIG. 1 shows a relatively small number of I/O blocks 2, CLBs 6 and block RAMs 8 for illustration purposes, it is understood that an FPGA typically includes many more of these elements. Details of components of typical FPGAs are described in "Virtex-II™ Pro, Platform FPGA Handbook", (Oct. 14, 2002) available from Xilinx, Inc., 2100 Logic Drive, San Jose, Calif. 95124, incorporated herein by reference.

In general, the FPGA of FIG. 1 is configured in response to a set of configuration data values that are loaded into a configuration memory array of the FPGA from an external store via configuration interface 14 and configuration logic 12. External configuration interface 14 can be, for example, a parallel select map interface, a JTAG interface, or a master-serial interface. The configuration memory array can be visualized as a rectangular array of bits. The bits are grouped into frames that are one-bit wide words that extend in columns from the top of the array to the bottom. For that reason only a complete column can be reconfigured. A frame is typically defined as the smallest part of the configuration memory array that can be written to or read from. The configuration data values are typically loaded into the configuration memory array one frame at a time from the external store via the configuration interface 14.

The FPGA can be reconfigured by rewriting data in the configuration memory array. In one reconfiguration method, the ICAP 20 is used to rewrite data in the configuration memory array in order to generate or instantiate the FPGA's internal logic (e.g., CLB's 6 and BRAMs 8). In other words, one part of the configured FPGA can reconfigure another part of the FPGA. Without using the ICAP, reconfiguration is performed by loading reconfiguration frames through the configuration interface 14 using external customized logic components to over-write frame data in the configuration memory array.

More efficient reconfiguration of an FPGA is performed by only rewriting a portion of the frames or columns in the configuration memory array that need to be changed, a process known as partial reconfiguration. One way to enable an FPGA to take advantage of partial reconfiguration is to have the FPGA partitioned into physically separate modules. Each module provides circuit resources for implementing a task, i.e. an algorithm. As the processing requirements change, one or more of the modules are updated only to a degree necessary to perform a new algorithm. Similarly, smaller manipulations of a module can be made such as a change in inputs and outputs. Because the underlying FPGA fabric is SRAM-based, modules can be updated indefinitely. Because modifications to the algorithms performed by a module typically require modification of only a portion of the frames in the configuration memory, efficient operation can result using partial reconfiguration.

In order to provide for efficient partial reconfiguration, a circuit arrangement shown in FIG. 2 is provided. To control reading and writing of data into the configuration memory array 30 of an FPGA, a controller 32 is used. For self-reconfiguration, the controller 32 is included with the ICAP 20 internal to the FPGA. For externally controlled reconfiguration, as opposed to self-reconfiguration, the controller 32 is provided outside the FPGA. To mirror data in the configuration memory array 30, configuration store 34 is used, enabling faster data reading and writing. The configuration store 34 speeds read and write operations because a bottleneck is otherwise created through the configuration interface 14 to the configuration memory array 30. Configuration interface 14 is a slow interface. With the configuration store 34 used, data is first modified in the configuration store 34 and later loaded into the configuration memory array 30 through the configuration interface 14 in a frame-by-frame manner. For partial reconfiguration, only the modified frames are loaded from the configuration store 34 and then written by the controller 32 into the configuration memory array 30 of the FPGA.

In a further embodiment for partial reconfiguration, the modification store 36 is added. The modification store 36 includes information identifying physical resources to be modified and the state to which they will be modified. As opposed to the configuration store 34, the controller 32 can read and modify portions of frames in the configuration store 34 using the modification store 36 as a reference, rather than being required to modify entire frames significantly reducing modification time.

Dynamic reconfiguration is a form of reconfiguration used to enable rapid updating of the configuration memory. Dynamic reconfiguration involves the active FPGA being fully or partially reconfigured to update algorithms, parameters or connections while concurrently enabling operation of active circuits not being changed. With dynamic reconfiguration, modules are programmed into the FPGA and when some of the modules need reconfiguring to update the tasks, i.e. algorithms implemented by some modules, other modules can continue operation.

To enable the reconfigurable modules to communicate, a network is typically placed in the FPGA for access by the modules. In one system, a packet based network system is formed. With a packet network, modules share access to the common communication network. The network physical layer (or circuitry enabling communication) is a shared resource between all the modules. In another system, a bus network is instantiated between modules. Like the physical layer of the packet network, the physical layer of the bus is shared by all of the modules, and each module must wait for the bus or physical communications layer to be relinquished.

A reconfigurable task based system programmed into an FPGA to implement a Digital Signal Processor (DSP) system has been provided by Interuniversity Micro-Electronics Center (IMEC), a research center in Belgium. To enable task communication, IMEC implemented an on-chip packet based network. Although the network enables high bandwidth communication, communication speed is limited because the module tasks share access to a common network. The physical layer can only be accessed by a limited number of modules transmitting data at one time. As congestion builds, data must be buffered and tasks must wait to transmit and receive data.

The University of Karlsruhe of Germany has implemented a reconfigurable task based system in an FPGA programmed to implement multiple control functions. Modern automobiles have numerous microprocessors for controlling systems like windows, wiper blades, and moon-roofs. The University of Karlsruhe system brings all of the control functions performed by microprocessors onto one FPGA. Because the microprocessors are not all required to function at the same time, their functions can be time swapped into FPGA modules using dynamic partial reconfiguration. To enable communication between a main control processor and the logic implementing microprocessor functions instantiated in the modules, a bus network is provided between them. Like the packet network, the physical layer of the bus network is shared by all of the modules, and each module must wait for the bus to be relinquished by other modules before transmitting its data.

SUMMARY

In accordance with embodiments of the present invention, a crossbar switch is implemented in a reconfigurable system, such as an FPGA, to resolve the problem of a shared physical layer where other modules must wait while one module communicates over the physical layer.

The crossbar switch is presented as an on-chip communications network for reconfigurable task based systems. A large amount of wiring resources required for a crossbar switch is typically a disadvantage in network systems, and buses or packet type systems were typically implemented to reduce the wiring necessary. The reduction in wiring resources are, however, obtained with an undesirable increase the amount of time for access to the network for communication. However, a reconfigurable system such as an FPGA has a significant amount of wiring resources readily available. The crossbar switch in one embodiment, labeled as a "partial connection crossbar," provides a separate connection from a module output to each module input. The crossbar switch can be easily updated, or reconfigured by a processor acting as a reconfiguration controller. Unlike packet networks and bus-based networks, a crossbar switch allows each module to independently communicate with other modules.

The crossbar switch can be implemented in CLBs in one of several different embodiments. In a first embodiment, a wide crossbar switch is created with CLB input multiplexers (IMUXs) linked to provide a separate channel for each communication path. For a wide crossbar switch providing a connection from every output to every input with a system having 928 module outputs and 928 module inputs, 4,836 CLBs are used. In a second embodiment, a Clos type crossbar switch is implemented reducing the number of CLBs required for a 928×928 system to 1,324 CLBs. In a third embodiment, the partial connection crossbar configuration is used to reduce CLBs required for a 1024×1024 crossbar switch to 256 CLBs. The partial connection crossbar is used for communication signals between modules, where data is typically sent in bytes of data at a time, so for example a Bit 0 output will only go to a Bit 0 input and not to other inputs such as Bit 1 or 2.

Unlike previous physical layer network implementations, the crossbar can be asynchronous allowing each connection to transmit at independent frequencies and phases. If synchronous communication between separate communication channels is desired, however, time delay circuits can be implemented in the channels to assure all channels provide an equal time delay. As opposed to providing a time delay circuit between each multiplexer in a crossbar switch to provide synchronization, with minimal circuitry in a channel path using a partial connection crossbar type switch, delay circuits can be provided as a flip-flop before the first multiplexer and after a last multiplexer in each channel path.

Rather than calling an auto-router to connect or disconnect modules, the crossbar's regular structure simplifies this to table look-ups. The crossbar is routed using Application Programming Interface (API) software that provides a library with the table look-ups specifying what resources need to be modified and the state they need changing to make input and output connections. This is contrasted with the typical use of an auto router program to configure a system. The auto router typically will not be able to perform wire-by-wire routing as the API can do.

Partial reconfiguration processes are contemplated for use to rapidly reconfigure both the modules and the crossbar switch used for communications according to the present invention. The crossbar switch is updated through reconfiguration at the same time that tasks are reconfigured into a module or moved between modules. During partial reconfiguration, tasks performed by the modules and the communications crossbar switch that are not being changed can continue operation.

BRIEF DESCRIPTION OF THE DRAWINGS

Further details of the present invention are explained with the help of the attached drawings in which.

DETAILED DESCRIPTION

Figure 1:
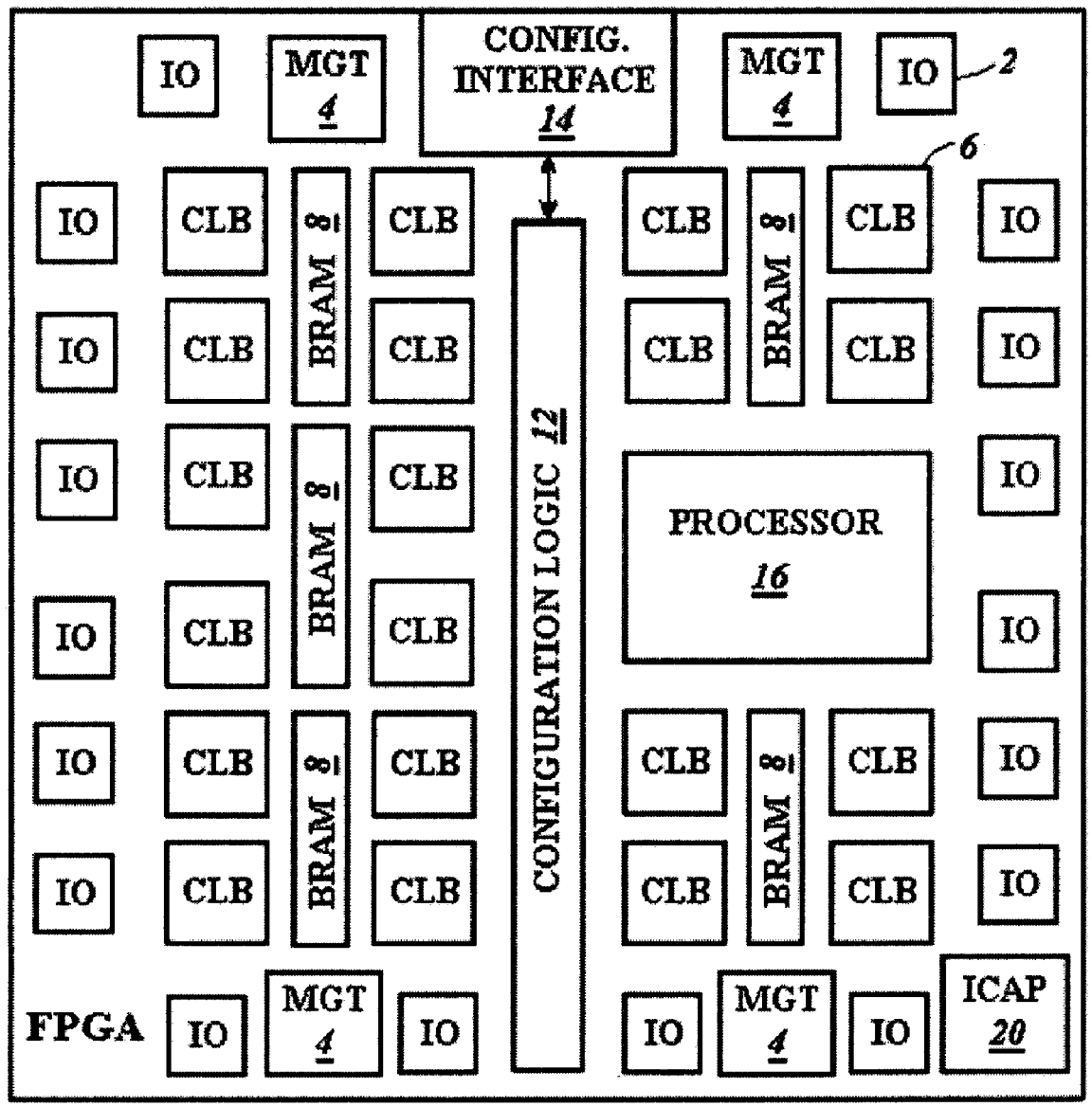
FIG. 1 is a block diagram showing components of a conventional FPGA.
Figure 2:
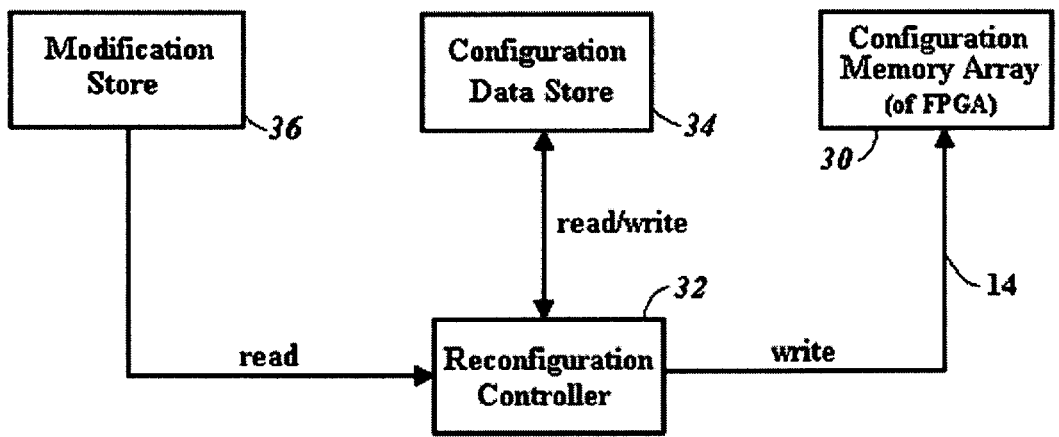
FIG. 2 is a functional block diagram of a circuit arrangement for providing partial reconfiguration of a FPGA.
Figure 3:
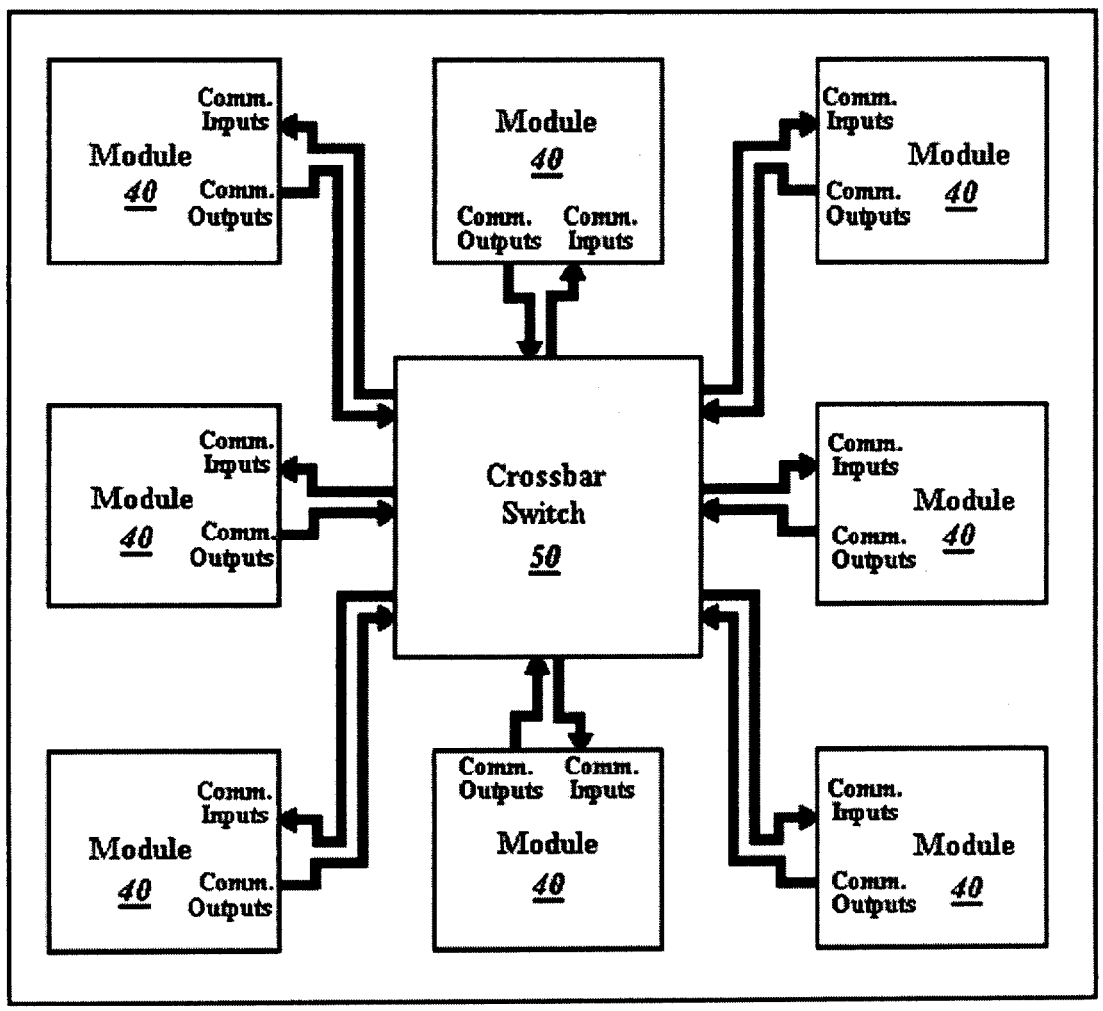
FIG. 3 illustrates an FPGA with resources configured into modules with a central crossbar switch providing communications links between the modules according to the present invention.

FIG. 3 illustrates a reconfigurable on chip network in accordance with an embodiment of the present invention. The on chip network can be implemented with a programmable logic device (PLD), for example an FPGA or, in an another example, a complex programmable logic device (CPLD). The structure includes a number of modules 40 having communication outputs connected through a crossbar switch 50 to communication inputs of other ones of the modules 40. In one embodiment, each module communication output is connected through the crossbar switch 50 to a corresponding communication input on a separate line in the "partial connection crossbar switch" configuration. The crossbar switch 50 is programmed into the reconfigurable chip logic, along with the modules 40. As the modules 40 have tasks they are implementing modified by reconfiguring the PLD, the crossbar switch 50 can likewise be reconfigured to link any module communication output and inputs that change.

Figure 4:
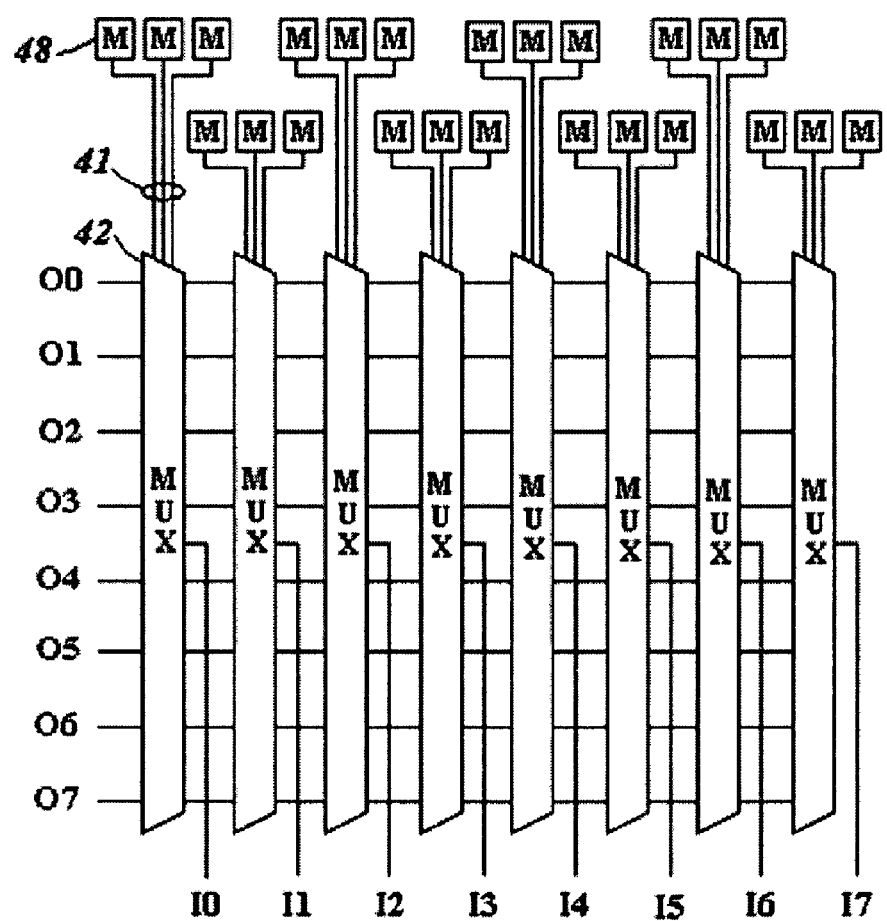
FIG. 4 illustrates an 8×8 crossbar switch configuration created with multiplexers in the logic fabric.

Crossbar switches are typically implemented in PLDs by forming multiplexers. FIG. 4 illustrates a multiplexer implementation of a crossbar switch. In FIG. 4, multiplexer 42 has controls 41 provided by configuration memory elements 48. The memory elements 48 are programmed to select only one of the module output signals O0-O7 to provide to each of the module input signals I0-I7.

In one type of PLD, the FPGA multiplexers used to form the crossbar switches are created by programming the configuration memory array so that input multiplexers (IMUXs) and/or look up tables (LUTs) of the CLBs of the FPGA form the multiplexers. Should reconfiguration of the FPGA be desirable, the configuration memory array can be reprogrammed to change the control inputs of the multiplexers. For convenience, although other PLDs may be used to implement the present invention, further description of implementation of the present invention will be described with respect to FPGAs.

The crossbar switch 50 can be implemented using several techniques. One embodiment is a wide crossbar switch implemented in a FPGA as described in U.S. Pat. No. 6,759,869, entitled "Large Crossbar Switch Implemented In FPGA" by Young et al., incorporated herein by reference (hereafter the '869 patent).

The '869 patent describes a wide crossbar switch with multiplexers implemented in an FPGA using two methods, one with LUTs of the CLBs alone and another using the IMUXs in combination with routing fabric. Although some embodiments of the present invention contemplate using either method to implement a crossbar switch, use of the IMUXs and routing fabric is preferred because it allows for higher density switches.

Regarding the first method of the '869 patent where CLBs are used to form multiplexers without reconfiguration, the multiplexers are formed using the LUTs of the CLBs. A typical LUT of a CLB provides a multiplexer having two data inputs and a control input. The LUTs of the CLBs are typically 4-input LUTs that can be programmed to implement the 2-input multiplexer. In one example, eight LUTs are present in a single CLB, so sixteen multiplexer data signals can be applied to these eight LUTs, two to each LUT. The LUTs are likewise described in the '869 patent to be combinable by interconnecting inputs to form larger multiplexers. As the number of input and output signals increase, the size of the crossbar switch becomes larger in proportion. As one example, for an array accommodating 1000 input signals and 1000 output signals if implemented with multiplexers, the crossbar switch would require 1000 multiplexers, each with 1000 input signals.

Figure 5:
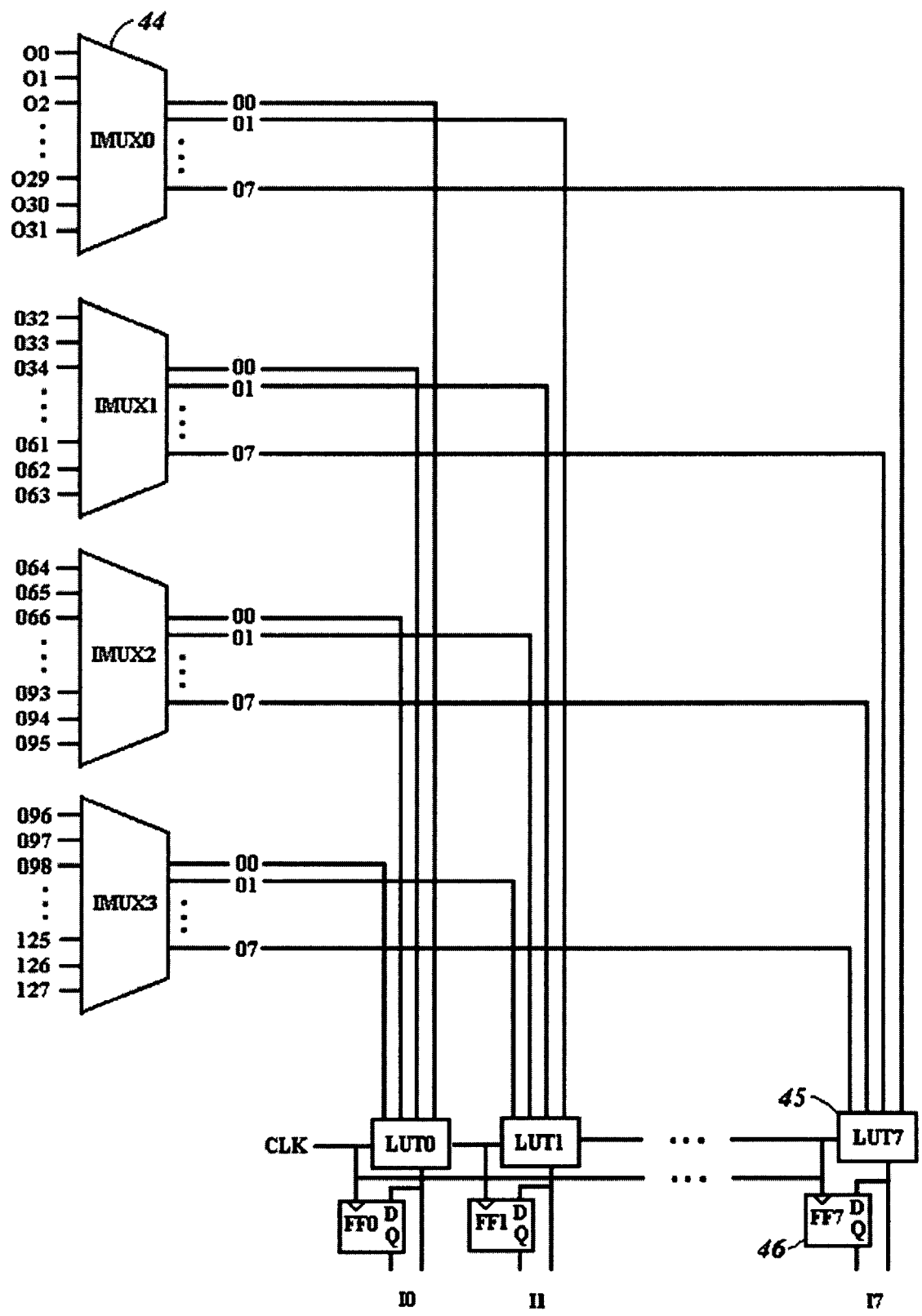
FIG. 5 illustrates components of a CLB, including IMUXs and LUTs that can be used to create a crossbar switch.

A second embodiment described in the '869 patent for creating multiplexers using reconfigurable IMUXs is illustrated in FIG. 5. The IMUXs 44 shown are included in a single CLB of an FPGA and serve to interconnect signals from the routing resources external to the CLB to eight LUTs shown within the CLB. Control inputs of the IMUXs 44 are set by memory cells in the configuration memory array to create channel paths and provide reconfiguration of paths. In addition to dynamic reprogrammability, the IMUXs 44 give a significant density improvement with limited resources, in that a 32:1 multiplexer can be used for each LUT 45. The LUTs 45 and IMUXs 44 can be configured together to provide a wide multiplexer. As another alternative, the LUTs 45 can be configured as one bit shift registers to function as a flip-flop providing output connections from the IMUXs 44. As illustrated, a path can be provided from the LUTs 45 either directly as an output, or through flip-flops 46 if desired.

With the configuration shown in FIG. 5, a 128×8 crossbar switch for routing 128 outputs to 8 inputs can be formed using the four 32 bit IMUXs 44 that feed eight four input LUTs 45 of a single CLB. A similar 16×8 crossbar switch can be formed with the eight LUTs 45 of the multiplexer without using the IMUXs 44, but will not readily allow dynamic reconfigurability. Additional details for forming crossbar switches using IMUXs and LUTs of CLBs is described in the '869 patent.

Figure 6:
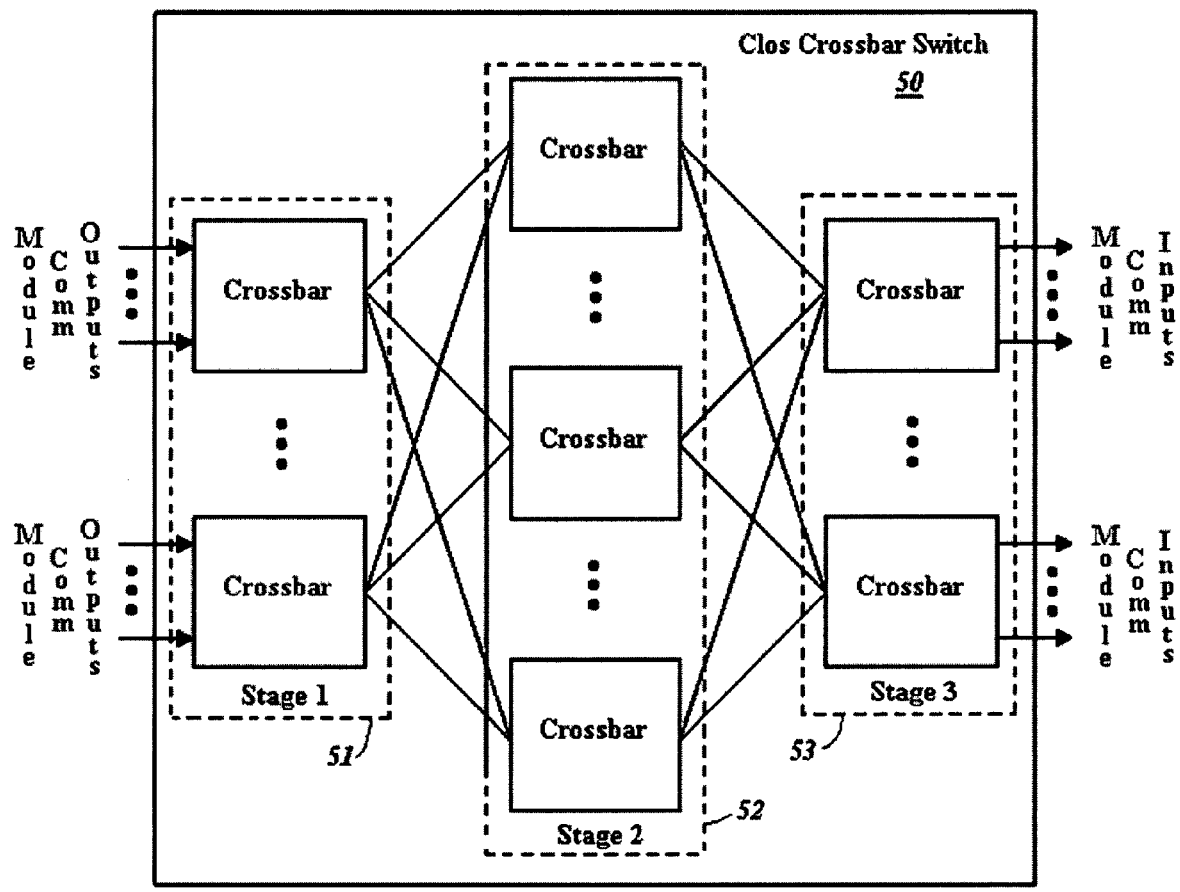
FIG. 6 is a block diagram showing a three-stage Clos crossbar switch used for the central crossbar switch of FIG. 3.

In another embodiment for the crossbar switch 50 of FIG. 3, a Clos crossbar structure is used to reduce the number of CLBs necessary to form the crossbar switch. The Clos crossbar switch is a three or more stage network of relatively small crossbar switches. The most common type of Clos crossbar switch is the three-stage network using rectangular crossbars in all stages. A block diagram for a three-stage Clos crossbar used for the crossbar switch 50 of FIG. 3 is shown in FIG. 6. The crossbar switch 50 includes three stages of CLBs 51, 52 and 53 with interconnections illustrated. In the crossbar switch configuration 50 with equal numbers of inputs and outputs, the middle stage switches are square. Each crossbar stage has one output connected to an input of each crossbar of the following stage.

A Clos crossbar switch implemented with components of a reconfigurable system such as an FPGA is described in U.S. Pat. No. 7,149,996 B1 by Patrick Lysaght, et al., issued on Dec. 12, 2006, which is incorporated herein by reference. The system described uses IMUXs of CLBs configured to form multiplexers, similar to the '869 patent.

Figure 7:
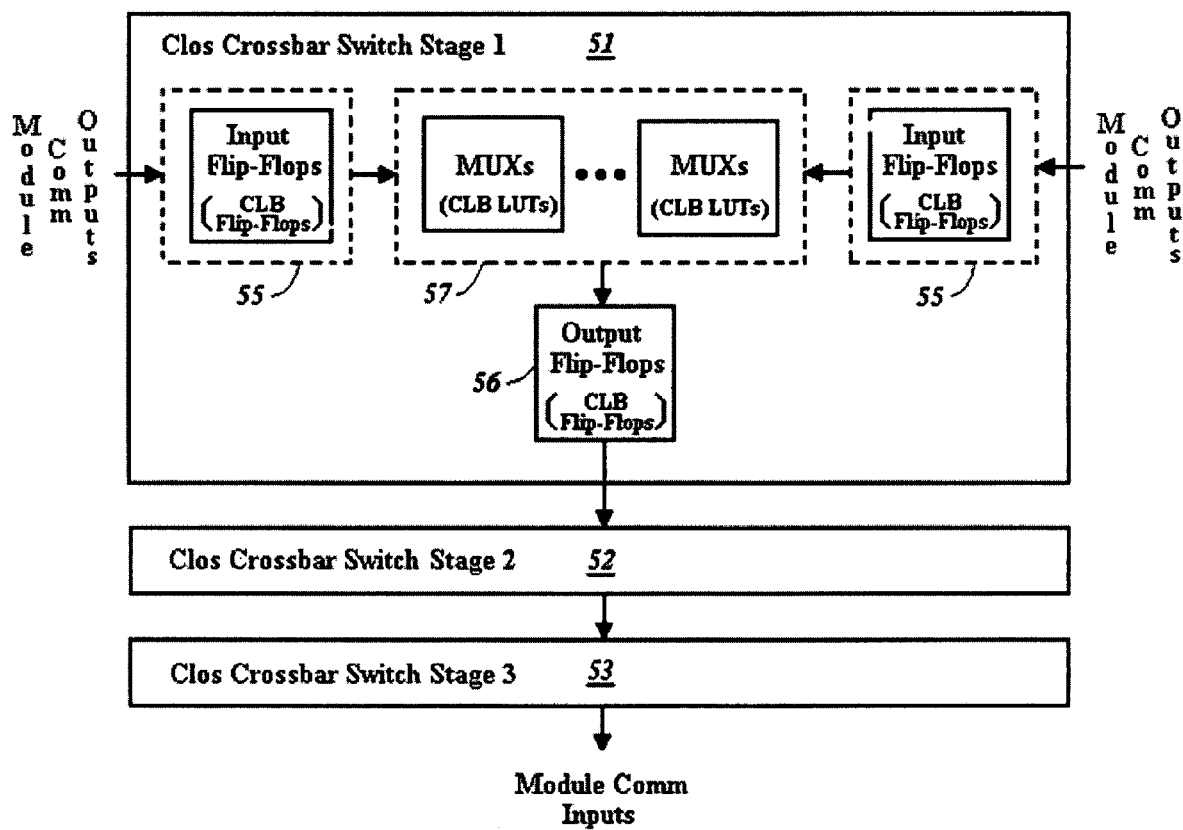
FIG. 7 illustrates details of components of an FPGA used to make up a stage of a Clos crossbar switch.

FIG. 7 illustrates details of components of an FPGA used to make up a stage of a Clos crossbar switch used to provide communications between modules. As shown, in a first stage 51, input flip-flops 55 connect the module outputs to multiplexers 57. The multiplexers 57, or IMUXs of a CLB, are interconnected for a Clos configuration to provide outputs through flip-flops 56 to the second stage 52, that in turn provides signals to a third stage 53. The outputs of the third stage 53 are then provided as module inputs. Further details of FPGA components used to form Clos stages are described in U.S. Pat. No. 7,149,996 B1, referenced previously.

A further reduction in CLB resources required for a crossbar switch to provide communications links between modules is implemented by connecting each module output only to a corresponding input in the "partial connection crossbar switch" mode. The partial connection crossbar is preferable for communication systems, since data bits of a byte will usually only go to a corresponding bit. For example, a Bit 0 output will only go to a Bit 0 input, and not to other inputs such as Bit 1 or 2. As described in accordance with embodiments of the present invention, communications between modules refers to transmission of a multiple bit signal including a header portion and data. Examples of communications signals sent between modules include internet protocol (IP) signals and asynchronous transfer mode (ATM) signals used in communication systems. A module, as describe herein then is logic configured to perform a task that can receive and/or transmit communication signals.

Figure 8:
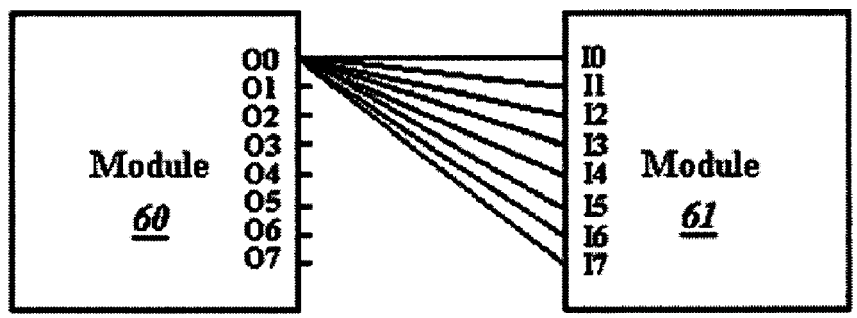
FIG. 8 illustrates standard connections between modules provided by a crossbar switch where each module output is connected to every module input.
Figure 9:
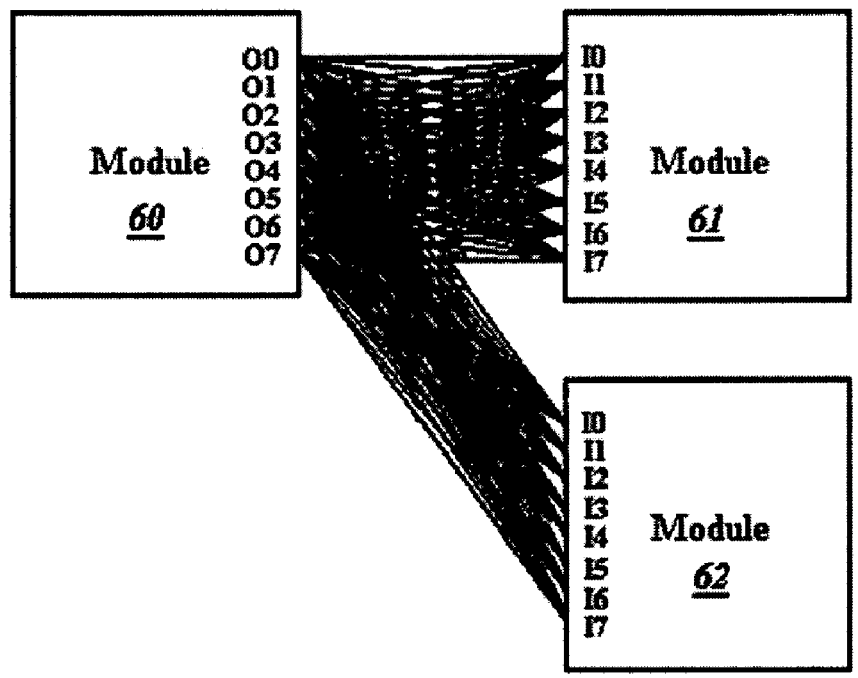
FIG. 9 shows standard connections as in FIG. 8 provided from outputs of a module to inputs of two other modules.
Figure 10:
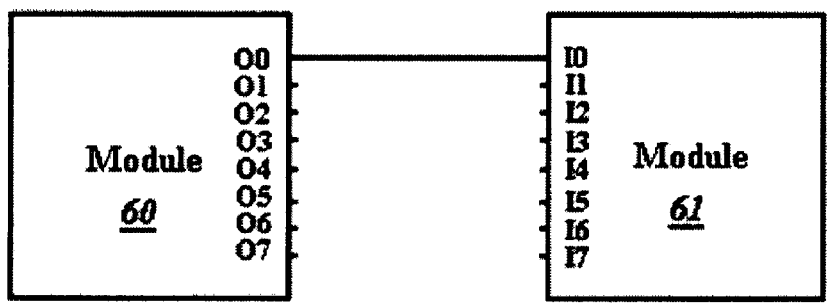
FIG. 10 illustrates connections of a module input only to a corresponding module output.
Figure 11:
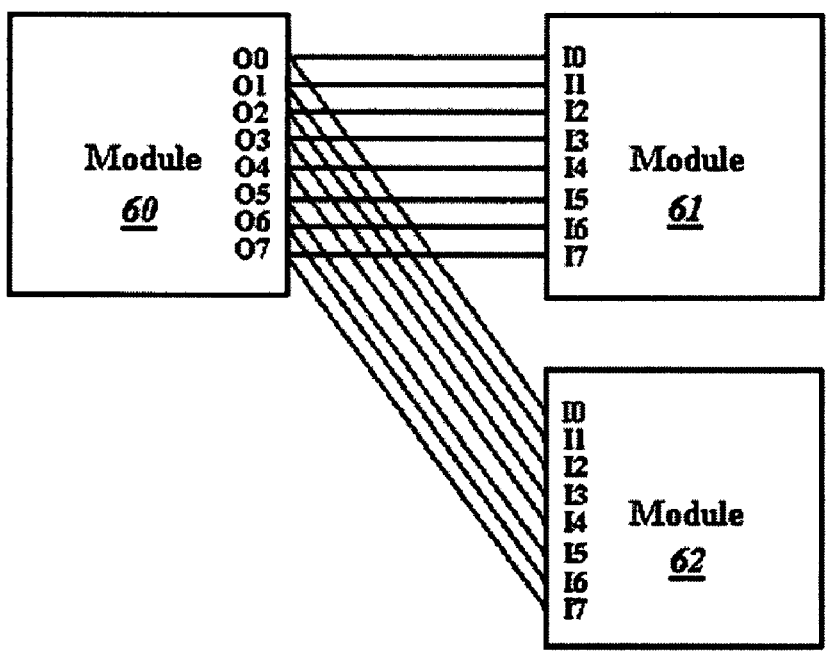
FIG. 11 illustrates connections as in FIG. 10 from outputs of a module to inputs of two other modules.

FIGS. 8-10 illustrate a difference between the partial crossbar switch and a wide crossbar switch with every output connected to every input. FIG. 8 illustrates standard connections between modules provided by a crossbar switch where each module output is connected to every module input. As shown in FIG. 8, an output Bit 0 (Labeled O0) from module 60 is connected to each of the input Bits 0-7 (Labeled I0-I7) of module 61. FIG. 9 shows connections similar to FIG. 8 made from all the outputs of module 60 to multiple modules 61 and 62. As shown, a significant number of connections are provided to connect between each output Bit 0-7 of module 60 and all the inputs of modules 61 and 62. FIG. 10 illustrates the reduction in connections using the partial connection crossbar where the Bit 0 output of module 60 is connected only to a corresponding Bit 0 output of module 61. FIG. 11 then illustrates the partial connection crossbar configuration with each output from module 60 connected to its corresponding input in modules 61 and 62.

Figure 12:
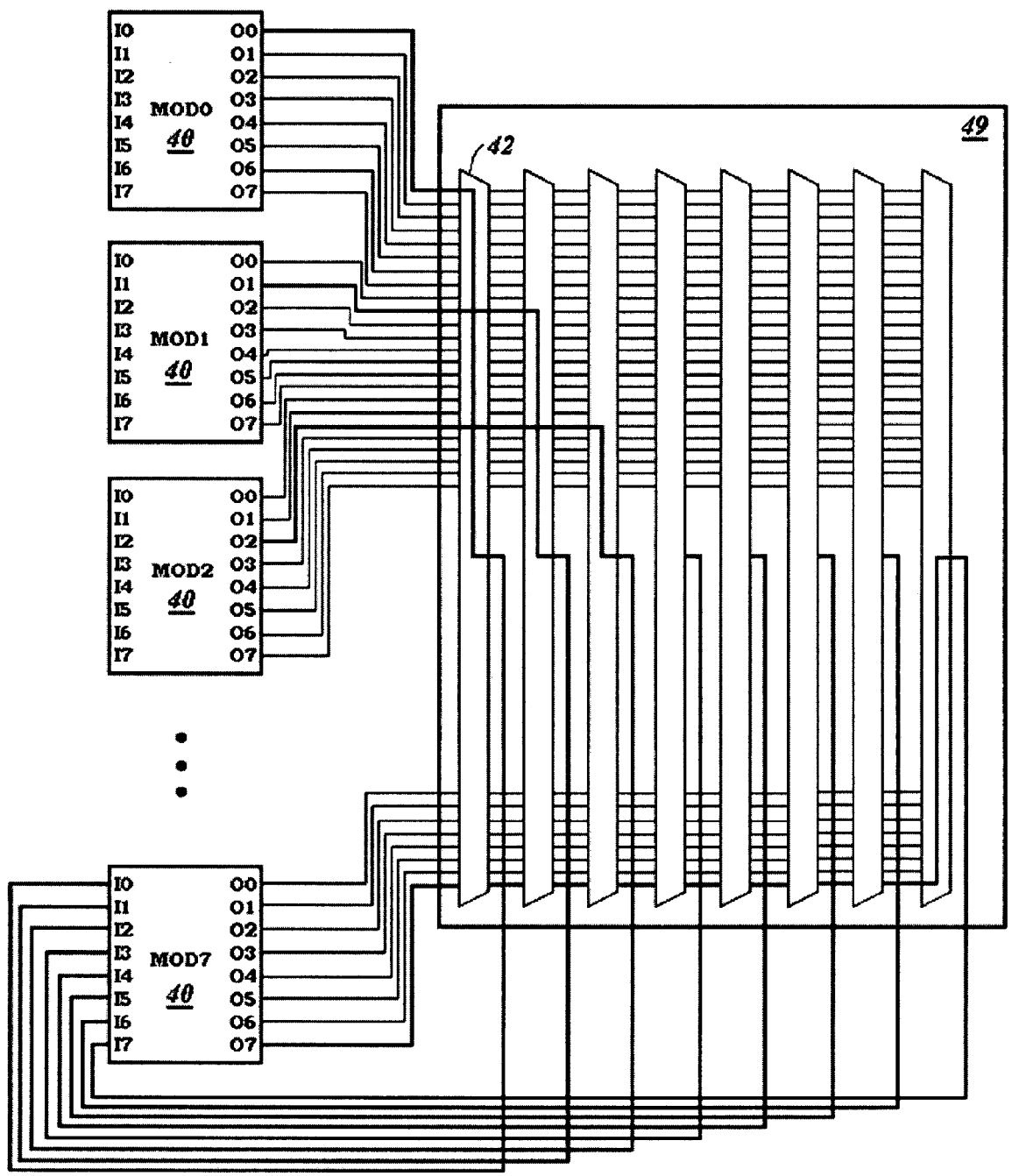
FIG. 12 illustrates an 64×8 crossbar switch configured as part of a partial connection type crossbar provided between two modules.

To further illustrate the partial connection type crossbar, FIG. 12 shows a 64×8 crossbar portion 49 of a 64×64 crossbar switch configured in a partial connection crossbar mode for interconnecting eight modules 40 (MOD0-MOD7). Each module 40 has eight outputs (O0-O8) and eight inputs (I0-I8). The crossbar switch 49 is made up of multiplexers 42, similar to FIG. 4. The 64×8 portion of the crossbar switch 49 shown serves to connect one output from each of the modules MOD0-MOD7 to a corresponding input of module MOD7. To complete the 64×64 crossbar switch, seven additional crossbar portions similar to crossbar portion 49 are needed to connect module outputs to the corresponding inputs of the remaining modules MOD0-MOD6. Bold lines illustrate connections selected for the multiplexers using the configuration memory so that each module output is connected to a corresponding module input. The multiplexers are preferably implemented using IMUXs to enable reconfigurability.

The tradeoff between different types of crossbar switches used in accordance with some embodiments of the present invention is a loss in fan out to achieve a corresponding size reduction. A wide crossbar switch has unlimited fan out since it provides multiple connections between every output and every input. The wide crossbar switch, however, has a significant size. A Clos crossbar reduces size at the expense of a reduction in fan out, since there is only one guaranteed path between each input and output. The partial connection crossbar switch significantly reduces fan out, but also provides a further reduction in size. As indicated previously, in a Clos type crossbar system with all inputs connected to all outputs, 1,324 CLBs are required to implement a 928×928 crossbar system. The proposed partial connection crossbar switch for a 1024×1024 crossbar only requires 256 CLBs.

The 32×32 reconfigurable crossbar provides the optimal area to I/O ratio, requiring only 8 CLBs in a Virtex-II or Virtex-II Pro architecture. Each 32×32 crossbar can implement 4 8×8 crossbars. For a 256×256 Clos crossbar switch, a first stage will use 16 16×32 crossbars, a second will use 32 16×16 crossbars and a third stage will use 16 32×32 crossbars. The 16×16 crossbars in the center stage can share a 32×32 crossbar by forming two 16×16 crossbar per two 32×32 crossbars. A full Clos crossbar for a 256×256 crossbar switch will require 48 32×32 crossbars. A 1024×1024 partial connection crossbar switch can be implemented using only 32 32×32 crossbars.

Besides the FPGA resource area required, one of the other benefits of using 32×32 crossbars instead of 8×8 crossbars, is that each output bit can connect to four different types of input bits. For example, output Bit 0 can connect to input Bits 0, 32, 64 and 96. Similarly, output Bit 1 can connect to input Bits 1, 33, 65 and 97. This means that the 128 bits can be sub-divided into 4 32-bit busses. Each 32-bit bus output can connect to any of the four 32-bit bus inputs on any of the modules (including a feedback path back to its own inputs).

With embodiments of the present system providing communication signals between modules where a separate channel is provided for each connection, asynchronous communication can be provided, as opposed to synchronous communications used for bus or packet type network structures. Irrespective of how the other communication channels are configured or the amount of data they transmit, with asynchronous communications a module is always free to communicate with any other module at the full data rate. Thus, in contrast with a typical synchronous circuit crossbar switch with time delay registers between each multiplexer, the delay circuits can be eliminated. Communication can be provided with multiplexers independent of time delay circuitry.

Controlling the use of time delay circuits to synchronize signals allows optimization of a trade-off between high frequency and high latency. With no time delay circuits, a low operation frequency as well as low latency can be obtained. A worst case delay will be defined by the path from the module output flip-flop to the module input flip-flop, should these flip-flops be used. Time delay circuits can be introduced to increase operation frequency if necessary at the expense of a higher latency.

If synchronization is required, or if it is otherwise necessary that all channel paths experience the same latency, time delay circuits can be implemented to delay signals so that all signal paths experience the same latency. With a partial connection crossbar switch, the number of multiplexers in a channel path will provide a latency of less than a clock cycle, so synchronization can be provided using a flip-flop before the first multiplexer and after the last multiplexer in a channel. The flip-flop can be either the CLB flip-flop, or a LUT configured as a one bit shift register. Flip-flops at the input and output can likewise be used for synchronization in a Clos type crossbar switch since by definition the Clos crossbar will have the same number of multiplexers in each channel path.

With the crossbar switch requiring wire-by-wire routing, a conventional system auto-router such as a Place And Route (PAR™) system cannot be used, so in one embodiment the crossbar switch is routed by hand using Application Programming Interface (API) software. The conventional auto-router cannot guarantee wire selections, but the API does not experience similar drawbacks. To guarantee that the channels between modules are physically independent, the routing between the modules and crossbar is physically separated. Since the auto-router cannot be constrained to route on a wire-by-wire basis, the routing must be explicitly specified on a wire-by-wire basis using the API software to construct the channels.

In this embodiment hand routing is performed to accommodate reconfiguration. For example, with a 32×32 crossbar used in one embodiment it is preferred that a custom chain of double wires be used to transmit data in a channel. In order to construct a communications channel, a correspondence between double wires used in the channel should be known. If a conventional auto-router were used for this task, it would arbitrarily select wires, and then during reconfiguration it would be unknown which wire to have the multiplexer select in order connect a module output to different inputs.

In this embodiment the hand routing of wires is accomplished using API software accessing a library that instantiates possible wiring connections from a Xilinx Design Language (XDL) netlist, which is a physical netlist. Construction of the crossbar is performed using a first program for setup of the crossbar and a second program for reconfiguration during run-time.

The first program running on an engineering workstation will establish the crossbar switch structure which includes instantiating the logic and the unchanging wire connections. The first program will write the crossbar into an XDL netlist. The XDL netlist is a physical netlist enabling logic and its placement to be instantiated, as well as specific wire instantiations for routing connections. The second program running in-system, either on the FPGA chip or external to it, will access a lookup table containing the IMUX locations in the bitstream and bit states in order to make or break crossbar connections.

Partial reconfiguration processes as described in U.S. Pat. No. 6,920,627 B2, by Brandon J. Blodget, et al, issued on Jul. 19, 2005 and U.S. Pat. No. 6,810,514 B1, by Peter H. Alfke, et al., issued on Oct. 26, 2004, both of which are herein incorporated by reference, are contemplated for use to rapidly reconfigure both modules and the crossbar switch. The crossbar switch is updated through reconfiguration at the same time that tasks are reconfigured into a module or moved between modules. During partial reconfiguration, tasks performed by module outputs that are not being changed can continue operation using the crossbar switch channels that likewise are not being changed. Only the channels of the modules and crossbar switch being changed remain inoperative during reconfiguration.

For reconfiguration of the crossbar switch using the IMUXs of CLBs, the FPGAs are updated by writing at least one frame of data into the configuration memory array. It is typically necessary to load full frames of data during a partial reconfiguration. In Virtex-II FPGAs available from Xilinx, this is true. Only a small amount of reconfiguration data will typically be required to reconfigure a crossbar switch structure forming a communications network, minimizing reconfiguration time.

For a communications network using the crossbar structure in accordance with an embodiment of the present invention, it is desirable to implement most of the crossbar switch as a static structure, and to change the connectivity of some lines to correspond with changes in modules. It is desirable to make a change in connectivity without disruption of any other connections that the switch is currently providing. A Virtex-II FPGA can be partially reconfigured by changing a few frames of configuration data. Ongoing communication can continue on all paths during the dynamic reconfiguration except the paths being reconfigured.

Although the present invention has been described above with particularity, this was merely to teach one of ordinary skill in the art how to make and use the invention. Many additional modifications will fall within the scope of the invention, as that scope is defined by the following claims.

What is claimed is:

1. A method for reconfiguring a Field Programmable Gate Array (FPGA) comprising:
   partially reconfiguring both the modules and the crossbar switch during operation of the FPGA, wherein signals are passed through communications channels of a portion of the crossbar switch not being reconfigured during the partial reconfiguration.

2. The method of claim 1, wherein the partial reconfiguration comprises performing self-reconfiguration using a control processor internal to the FPGA to load frames from a configuration store into a configuration memory.

3. The method of claim 1, wherein the partially reconfiguring comprises using a control processor external to the FPGA to load frames from a configuration store into a configuration memory.

4. The method of claim 1, wherein the partially reconfiguring comprises:
   programming the modules using an auto router, each of the modules configured for performing a task; and
   programming the crossbar switch using software separate from the auto router that selects wiring for the communication channels provided between a module output and a module input from a net list.

5. A processor readable code stored in a physical medium, the code causing a processor to execute steps to reconfigure an FPGA according to the method of claim 3.

6. A Field Programmable Gate Array (FPGA) containing software and components enabling instantiating of the FPGA with separate modules for implementing tasks and a crossbar switch for providing communication channels between the modules; and
   wherein the software enables instantiating a connection from each module output only to corresponding inputs of other modules.

7. The FPGA of claim 6, where the software enables instantiating components of the crossbar switch for asynchronous communication between different ones of the communication channels.

* * * * *